United States Patent
Dams (10) Patent No.: US 7,061,587 B2
(45) Date of Patent: Jun. 13, 2006

(54) CONTROL SYSTEM, LITHOGRAPHIC APPARATUS, DEVICE MANUFACTURING METHOD, AND DEVICE MANUFACTURED THEREBY

(75) Inventor: Johannes Adrianus Antonius Theodorus Dams, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 40 days.

(21) Appl. No.: 10/842,639

(22) Filed: May 11, 2004

(65) Prior Publication Data

US 2004/0238758 A1    Dec. 2, 2004

(30) Foreign Application Priority Data

May 13, 2003    (EP) .................................. 03252965

(51) Int. Cl.
G03B 27/58    (2006.01)
G03B 27/62    (2006.01)
G03B 27/42    (2006.01)

(52) U.S. Cl. .............................. 355/72; 355/53; 355/75
(58) Field of Classification Search .................. 355/72, 355/75
See application file for complete search history.

(56) References Cited

U.S. PATENT DOCUMENTS

| | | | |
|---|---|---|---|
| 3,958,109 A * | 5/1976 | Doherty et al. ................ 700/77 |
| 4,093,904 A * | 6/1978 | Burig et al. ................ 318/616 |
| 4,383,208 A * | 5/1983 | Nielson ....................... 318/618 |
| 4,902,944 A | 2/1990 | Daggett et al. |
| 4,990,001 A | 2/1991 | Losic et al. |
| 5,191,272 A * | 3/1993 | Torii et al. ................... 318/609 |
| 6,052,252 A * | 4/2000 | Kim ........................ 360/78.09 |
| 2003/0016340 A1 | 1/2003 | Butler |
| 2003/0043354 A1 | 3/2003 | Butler |
| 2003/0173556 A1 | 9/2003 | Watson |
| 2004/0176861 A1* | 9/2004 | Butler .......................... 700/63 |
| 2005/0052149 A1* | 3/2005 | Kameyama ................. 318/600 |
| 2005/0179880 A1* | 8/2005 | Butler et al. .................. 355/53 |

FOREIGN PATENT DOCUMENTS

JP    3189996    5/2001
KR    0165436    3/1999

OTHER PUBLICATIONS

Korean Office Action issued in Korean Application No. 10-2004-0032958 dated Oct. 31, 2005.

* cited by examiner

*Primary Examiner*—Rodney Fuller
(74) *Attorney, Agent, or Firm*—Pillsbury Winthrop Shaw Pittman, LLP (57) ABSTRACT

A control system for a positioning device includes a controller connected in a feedback loop. The controller calculates a current for supply to the positioning device according to the error between a desired current value and a measured current value. This current is converted to a voltage by an amplifier and further modified by a feedforward voltage calculated using mechanical and electrical characteristics of the positioning device and a desired position and/or desired derivatives of position.

19 Claims, 4 Drawing Sheets

CONTROL SYSTEM, LITHOGRAPHIC APPARATUS, DEVICE MANUFACTURING METHOD, AND DEVICE MANUFACTURED THEREBY

This application claims priority to European Patent Application 03252965.3, filed May 13, 2003, the contents of which are incorporated by reference.

BACKGROUND OF THE INVENTION

1. Field of the Invention

The present invention relates to a control system for a positioning device. The present invention also relates to lithographic apparatus, a device manufacturing method, and a device manufactured thereby.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An examples of a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can include one or more programmable mirror arrays. More information on mirror arrays as here referred to can be found, for example, in U.S. Pat. No. 5,296,891 and U.S. Pat. No. 5,523,193 and PCT Patent Application Publications WO 98/38597 and WO 98/33096, which are incorporated herein by reference. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872, which is incorporated herein by reference. As above, the support may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning devices as set forth above.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be found, for example, in U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types to direct, shape or control the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796, incorporated herein by reference.

Figure 5:
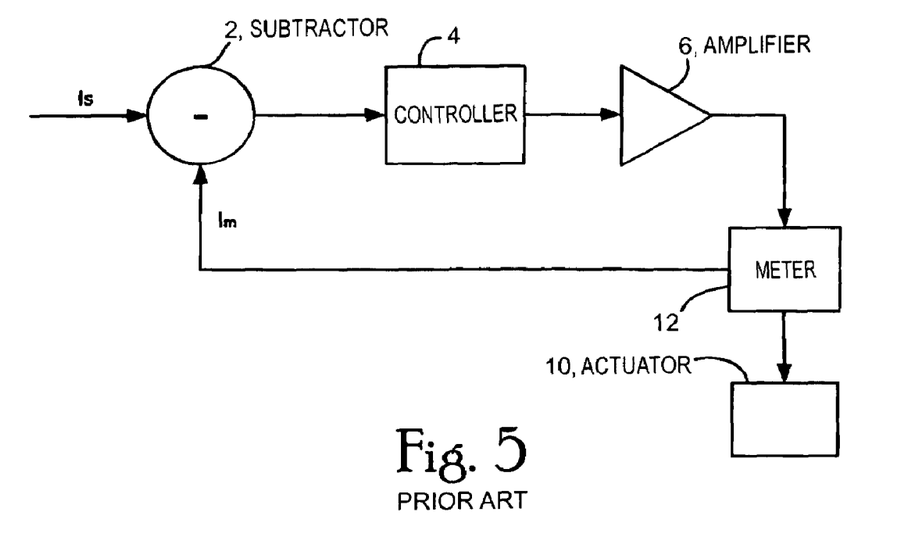
FIG. 5 depicts a standard feedback control system for a current amplifier according to the prior art.

During manufacture it is necessary to move the substrate into the correct position for loading, unloading and exposure. It may also be necessary to move the mask. It is important that any movements are carried out as quickly and accurately as possible, to improve the throughput of the apparatus and the quality of the exposed substrates. Typically movement is controlled by a motion controller based on desired position, velocity and acceleration. The motion controller generates a desired current or voltage to be supplied to an actuator such that the desired position, velocity and acceleration are obtained. This desired current is input to an amplifier control system connected in a feedback loop to ensure the desired current or voltage is supplied to the actuator. A simplified diagram of the control system for a single phase actuator is shown in FIG. 5.

The motion controller provides the input of the desired current $I_s$. The present value of the current $I_m$ is measured by a meter 12. The present value of the current $I_m$ is subtracted from the desired current $I_s$ by a subtractor 2 to give an error which is fed into the controller 4. The controller 4 calculates a new voltage setpoint, which is then converted by the amplifier 6 into a voltage which is provided to the actuator 10. The controller 4 is typically of the proportional, integral, differential (PID) type.

The parameters of the controller 4 are determined by considering the mechanical and electrical characteristics of the system. The response is constrained by the requirement to keep the system stable, accurate and within specified limits of phase difference. These constraints limit the speed at which movement to a desired position can be achieved.

Figure 6:
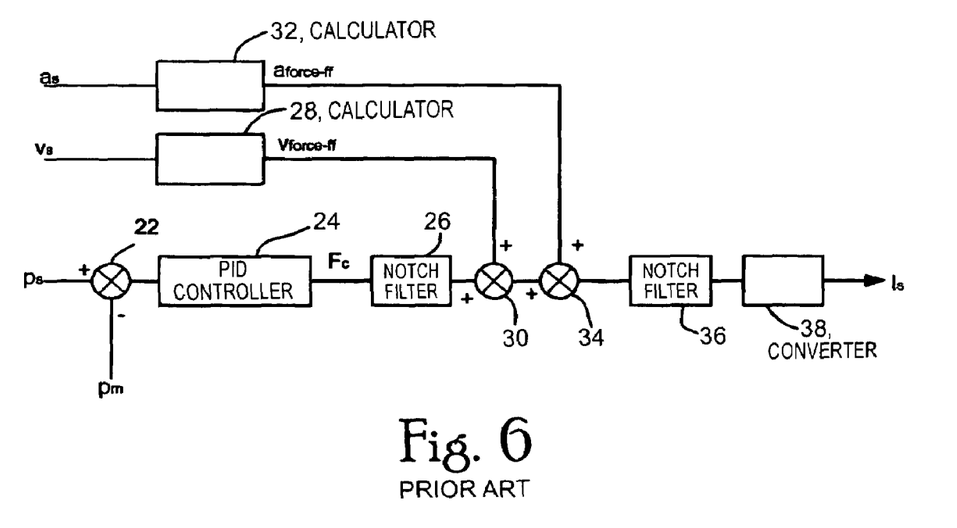
FIG. 6 depicts the use of acceleration and velocity feedforward in the determination of a current setpoint according to the prior art.

The performance of the system has been improved by adding velocity and acceleration feedforward control into the calculation of the desired current $I_s$ in the controller 4. Such a system is illustrated in FIG. 6. A PID controller 24 has an input of the error between the measured position $p_m$ and a desired position $p_s$ from a setpoint generator. It outputs a force $F_c$ to move into the desired position $p_s$. A notch filter 26 suppresses a specific frequency in the closed loop system, to give better closed loop performance.

Calculators 32 and 28 respectively carry out an acceleration feedforward calculation and a velocity feedforward calculation using the desired values for acceleration $a_s$ and velocity $v_s$ from the setpoint generator, and knowledge of the mechanical characteristics of the system. The results of the feedforward calculation, $a_{force-ff}$ and $v_{force-ff}$, are added to the output of the notch filter 26 by summing devices 30, 34. A further notch is added by a notch filter 36. Finally the force is converted into a current setpoint $I_s$ by the converter 38 using the motor constant. The motor constant defines how many Newtons per amp the actuator delivers.

This modified system has improved response but suffers from the constraints of the current amplifier control system, which uses only feedback control. For example, if a current of 14A is desired it will not be produced instantaneously. The response will be delayed by the requirement to keep the current controller stable and any phase difference in the system. This places limitations on the speed of movement and accuracy of the system.

SUMMARY OF THE INVENTION

It is an aspect of the present invention to improve the accuracy and speed of a movement control system.

This and other aspects are achieved according to the invention in a control system including a setpoint generator configured to calculate a desired current or voltage for supply to a positioning device according to a desired position and/or derivatives thereof of the positioning device; a controller configured to outputt a signal to be supplied to the positioning device according to the desired current or voltage; and at least one sensor configured to measure a present value of the current or the voltage. The controller is connected in a feedback loop such that the controller has as its input the error between the desired current or voltage and the measured current or voltage. By adding at least one feedforward value to the output of the controller before it is supplied to the positioning device, the feedforward value is calculated using mechanical and/or electrical characteristics of the positioning device and the desired position and/or derivatives thereof of the positioning device.

The reference to a desired position and/or derivatives thereof includes position, velocity, acceleration and higher derivatives. The reference to mechanical and/or electrical characteristics includes back-emf, resistance, self inductance and the motor constant of the positioning device, as well as the moving mass. The positioning device may be an actuator or a single or multi-phase motor.

Thus, the present invention adds feedforward control into the current or voltage control loop. As described above, feedforward control has been applied to the calculation of a current or voltage setpoint, but not to the control of the current or voltage controller used to reach the setpoint.

By providing an additional feedforward control element the accuracy and speed of the response is increased. The system also suffers less phase delay, allowing higher overall performance and stricter design criteria to be applied.

The limiting factor on the rate of change of current or voltage is now determined by the feedforward value and the power stage of the amplifier, rather than the bandwidth of the current or voltage control loop. Errors are reduced and servo performance increases. Furthermore, the behavior of the system is more predictable and controllable. The system behaves less like a "black box."

A velocity feedforward value may be calculated using the back-emf of the positioning device, which is known, and the desired velocity of the positioning device. The velocity feedforward value may be calculated by multiplying the back-emf and the desired velocity together.

An acceleration feedforward value may be calculated using the reciprocal of the motor constant of the positioning device, the electrical resistance of the positioning device, the effective moving mass, which are all known, and the desired acceleration of the positioning device. The acceleration feedforward value may be calculated by multiplying these values together.

A jerk feedforward value may be calculated using the reciprocal of the motor constant of the positioning device, the effective moving mass, the self inductance of the positioning device, which are all known, and the desired jerk of the positioning device. "Jerk" is used to refer to the first derivative of acceleration (i.e., the third derivative of position).

By calculating one or more of the above feedforward values and adding them to the output of the controller, the performance is increased. The calculation of the feedforward values can be implemented without requiring undue complexity in the controller. The values relating to characteristics of the positioning device may be set once and forgotten, or refined using knowledge of the performance of the individual system in use. The mechanical values used in the feedforward calculations reflect the mechanics of the positioning device. Thus, if a gear ratio is present between the positioning device and the payload the values used in the feedforward calculations will be need to be modified appropriately.

Higher derivatives of position may also be calculated and included, for example "D-jerk",the first derivative of jerk (i.e., the fourth derivative of position).

Optionally, the positioning device may be a multiple phase actuator, and further include a commutator for each phase to adjust the value of the desired current or voltage and the feedforward value. This allows the control system to be easily adapted for use with multiple phase actuators. There is no need to alter the calculation of the feedforward value, the result is adjusted by the commutator.

According to a further aspect of the invention there is provided a lithographic projection apparatus including a radiation system configured to provide a beam of radiation; a support configured to support a patterning device, the patterning device configured to pattern the beam according to a desired pattern; a substrate table configured to hold a substrate; a first positioning device configured to move the substrate table; a projection system configured to project the patterned beam onto a target portion of substrate; and a control system as described above configured to control the first positioning device.

The lithographic projection apparatus may further include second positioning device configured to move the support, wherein a the control system as described above is used to control the second positioning device.

Thus, the operation of the lithographic apparatus is improved. The speed of movement of the first and/or second device is increased, allowing greater throughput. Accuracy of the movement is also improved.

According to a further aspect of the invention there is provided a method for controlling a positioning device, the method including calculating a desired current or voltage for supply to the positioning device according to a desired position and/or derivatives thereof of the positioning device; subtracting a measured current or voltage from the desired current or voltage, respectively, to calculate an error value; inputting the error value to a controller which outputs a signal, the signal being input to the positioning device; calculating a feedforward value using mechanical and/or electrical characteristics of the positioning device and the desired position and/or derivatives thereof of the positioning device; and adding the feedforward value to the signal input to the positioning device.

According to a still further aspect of the present invention, there is provided a device manufacturing method including providing a substrate that is at least partially covered by a layer of radiation-sensitive material; providing a beam of radiation using a radiation system; using a patterning device to endow the projection beam with a pattern in its cross-section; projecting the patterned beam of radiation onto a target portion of the layer of radiation-sensitive material, wherein movements of the patterning device and/or the substrate are controlled using a control method as described above.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms. "reticle","wafer" or "die" in this text should be considered as being replaced by the more general terms "mask","substrate" and "target portion",respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
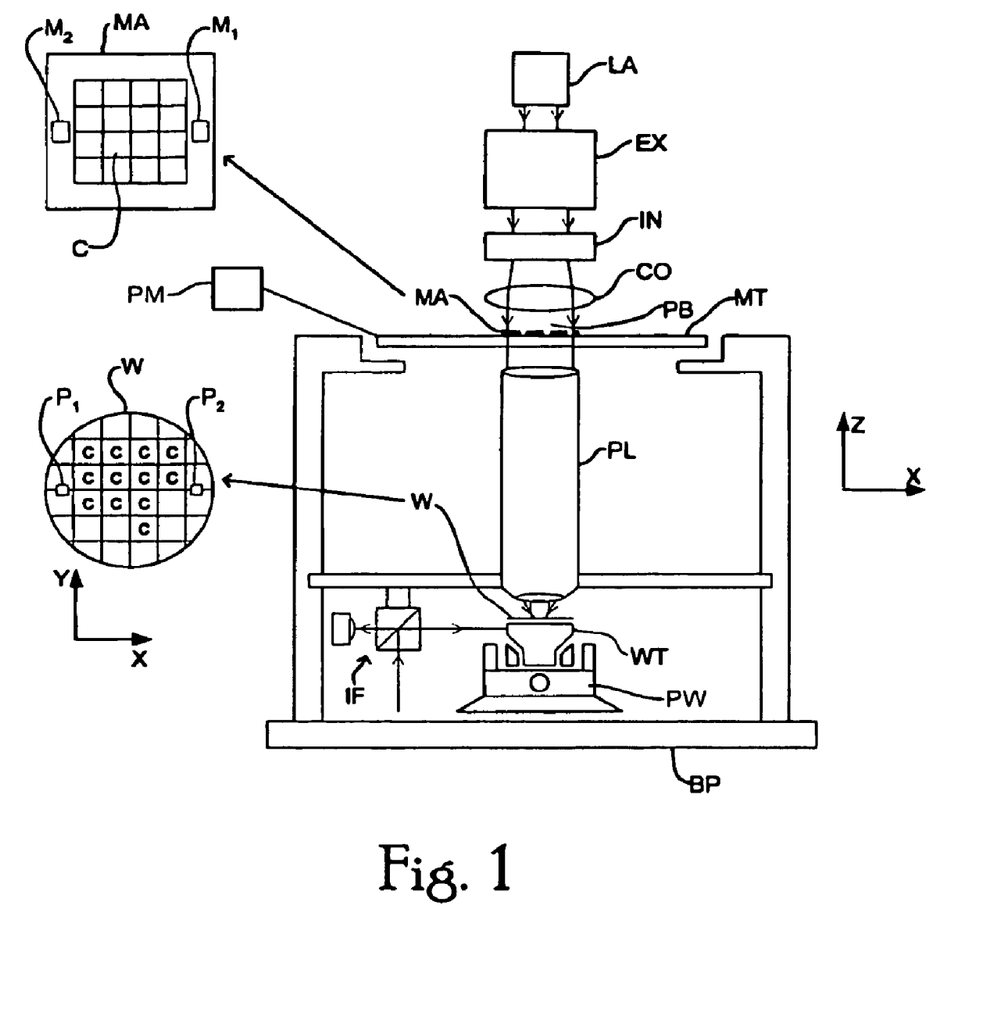
FIG. 1 depicts a lithographic projection apparatus according to an exemplary embodiment of the present invention.

FIG. 1 schematically depicts a lithographic projection apparatus according to an exemplary embodiment of the present invention. The apparatus includes a radiation system Ex, IL configured to supply a beam PB of radiation (e.g. EUV radiation), which in this case also includes a radiation source LA. A first object table (mask table) MT is provided with a mask holder configured to hold a mask MA (e.g. a reticle) and is connected to a first positioning device that accurately positions the mask with respect to a projection system ("lens") PL. A second object table (substrate table) WT is provided with a substrate holder configured to hold a substrate W (e.g. a resist-coated silicon wafer) and is connected to a second positioning device PW that accurately positions the substrate with respect to the projection system PL. The projection system ("lens") PL (e.g. a mirror group)

images an irradiated portion of the mask MA onto a target portion C (e.g. including one or more dies) of the substrate W.

As here depicted, the apparatus is of a reflective type (i.e., has a reflective mask). However, in general, it may also be of a transmissive type (i.e., have a transmissive mask). Alternatively, the apparatus may employ another kind of patterning device, such as a programmable mirror array of a type as referred to above.

The source LA (e.g. a laser-produced or discharge plasma source) produces radiation. This radiation is fed into an illumination system (illuminator) IL, either directly or after having traversed a conditioning device(s), for example a beam expander Ex. The illuminator IL may include an adjusting device AM to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation which it produces being led into the apparatus.(e.g. with the aid of suitable directing mirrors). The latter is often the case when the source LA is an excimer laser. The present invention encompasses both scenarios.

The beam PB subsequently intercepts the mask MA, which is held on a mask table MT. Having been selectively transmitted by the mask MA, the beam PB passes through the projection system PL, which focuses the beam PB onto a target portion C of the substrate W. With the aid of the second positioning device (and an interferometric measuring device IF), the substrate table WT can be moved accurately, for example, so as to position different target portions C in the path of the beam PB. Similarly, the first positioning device PM (and an interferometric measuring device which is not explicitly shown) can be used to accurately position the mask MA with respect to the path of the beam PB, for example after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e., a single "flash") onto a target portion C. The substrate table WT is then shifted in the X and/or Y direction so that a different target portion C can be irradiated by the beam PB;
2. In scan mode, essentially the same scenario applies, except that a given target portion C is not exposed in a single "flash". Instead, the mask table MT is movable in a given direction (the so-called "scan direction",e.g. the y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
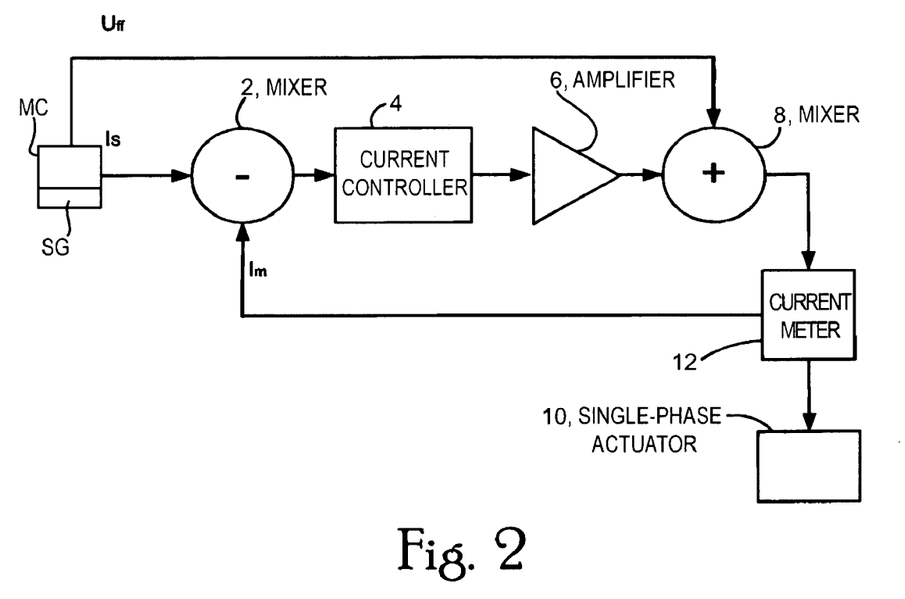
FIG. 2 depicts a single-phase feedforward control system for a current amplifier according to an exemplary embodiment of the present invention.

FIG. 2 illustrates a current amplifier and control system for a single-phase actuator 10, for example a single phase motor, according to an exemplary embodiment of the present invention. The actuator 10 is attached to the wafer table WT. The system of FIG. 2 is duplicated for each further actuator attached to the wafer table WT. It may also be duplicated to supply the actuators of the mask table MT if that is movable.

A motion controller MC calculates the setpoint current $I_s$ using the desired position, velocity and acceleration of the wafer table WT and the measured position. In this embodiment, the method of calculating the setpoint current $I_s$ is the same as that described above in the discussion of the prior art with reference to FIG. 5.

The current meter 12 measures the present value $I_m$ of the current through the actuator 10. The present value $I_m$ is then subtracted from the setpoint current $I_s$ by a mixer 2 to give an error value. This error value is then supplied as the input to the current controller 4. The current controller 4 uses a control algorithm to determine the value of voltage to be supplied to the actuator 10 in order to reach the setpoint current $I_s$. In this embodiment, the control algorithm used is PID, but others such as fuzzy logic or proportional-integral could also be used. An amplifier 6 is then used to supply this voltage to the actuator 10. In this embodiment, the current controller 4 is implemented in a programmable DSP, microprocessor, microcontroller or any other type of digital controller and forms part of the overall motion controller MC. The current controller 4 could also be constructed from discrete components.

A feedforward voltage $U_{ff}$ is also calculated by the motion controller MC and is added to the output of the amplifier 6 by a mixer 8. The resultant voltage is then applied to the actuator 10. The process is repeated continuously as the setpoint current $I_s$ varies according to the desired movements.

The feedforward voltage $U_{ff}$ calculated in this embodiment includes three individual components: velocity $v_{ff}$, acceleration $a_{ff}$ and jerk $j_{ff}$ (jerk is the derivative of acceleration). A flow chart showing calculation of the feedforward components is given in FIG. 3.

Figure 3:
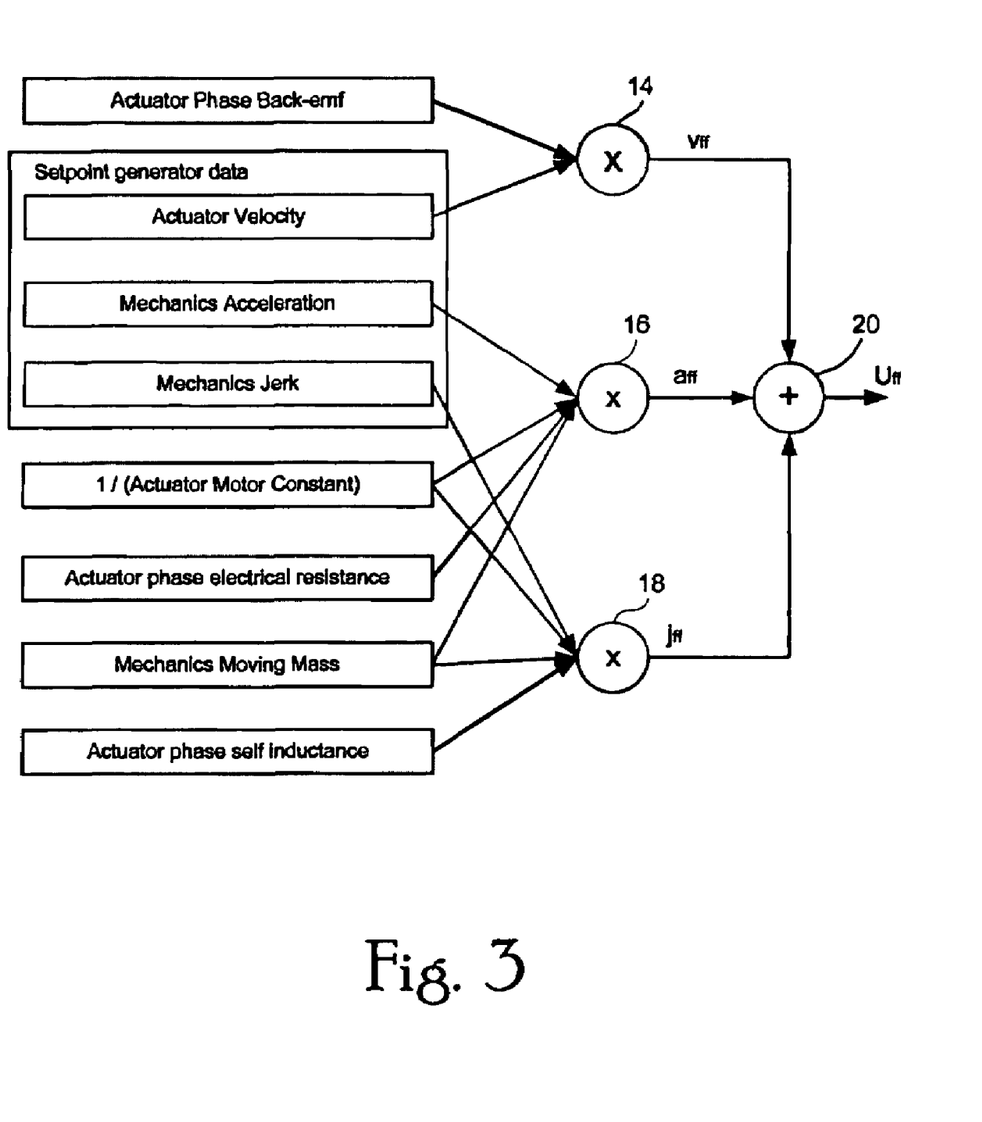
FIG. 3 depicts the calculation of voltage feedforward values in the form of a flow chart according to an exemplary embodiment of the present invention.

Calculation of the feedforward voltage $U_{ff}$ requires knowledge of several variables. The setpoint generator SG provides the desired velocity, acceleration and jerk. Additionally the moving mass and four actuator characteristics (back-emf, resistance, self-inductance, and the reciprocal of the motor constant) are stored in the motion controller MC. These stored values may be updated dynamically as the behavior of the system in use is monitored or calibrated periodically.

The desired values are determined by the setpoint generator SG according to the movement required and permitted maximum values. During operation it is likely that there will be a maximum acceleration or velocity which cannot be exceeded to avoid risk of damage, etc. These maximums form the constraints that limit the response of the system. For example, the maximum value of acceleration will impose a limit on how quickly a given velocity can be achieved.

The velocity feedforward $v_{ff}$ is calculated by multiplying the actuator back-emf and the desired velocity together (illustrated by the multiplier 14).

The acceleration feedforward aff is calculated by multiplying the desired acceleration, actuator resistance, moving mass and reciprocal of the actuator motor constant together (illustrated by the multiplier 16).

The jerk feedforward $j_{\mathit{ff}}$ is calculated by multiplying the desired jerk, moving mass, actuator phase self inductance and reciprocal of the actuator motor constant together (illustrated by the multiplier 18).

These three feedforward components are added (illustrated by adder 20) to give the final voltage feedforward value $U_{\mathit{ff}}$. The voltage feedforward $U_{\mathit{ff}}$ is added to the output of the amplifier 6 in FIG. 2 by the adder 8.

The derivation of these feedforward values will now be explained. The voltage across a coil in the actuator includes three components and is calculated as follows:

$$U = (IR) + \left(L\frac{dI}{dt}\right) + (B_{emf}V) = a_{\mathit{ff}} + j_{\mathit{ff}} + v_{\mathit{ff}},$$

where U is the coil voltage, I is the actuator current, R is the resistance, L is the self inductance of the actuator, t is time, $B_{emf}$ is the back-emf and V is the velocity. Each of the three components can be calculated using the desired value of velocity, acceleration and jerk together with the mechanical and electrical characteristics of the system.

The velocity feedforward $v_{\mathit{ff}}$ is calculated as follows:

$$v_{\mathit{ff}} = B_{emf}V$$

The acceleration feedforward $a_{\mathit{ff}}$ is calculated as follows:

$$F = ma = KI \Rightarrow I = \frac{ma}{K}$$
$$a_{\mathit{ff}} = IR = \frac{ma}{K}R,$$

where F is the force, K is the motor constant, m is the mass of the moving system and a is the desired acceleration.

The jerk feedforward $j_{\mathit{ff}}$ is calculated as follows:

$$ma = KI \Rightarrow m\frac{da}{dt} = K\frac{dI}{dt} \Rightarrow mJ_d = K\frac{dI}{dt}$$
$$j_{\mathit{ff}} = L\frac{dI}{dt} = L\frac{mJ_d}{K},$$

where $J_d$ is the desired jerk. These equations assume that the actuator is directly coupled to the payload. If a gear ratio is used between the actuator and the payload the values of moving mass, desired velocity, desired acceleration and desired jerk will need to be modified appropriately.

The use of a voltage feedforward value improves the response and accuracy of the system with little extra cost. The calculation of the feedforward value is relatively simple and uses readily available data so the controller can be improved with little increase in complexity. The limiting factor on the response is now determined by the feedforward value and not the bandwidth of the current control loop. This leads to a faster response with less phase difference.

Figure 4:
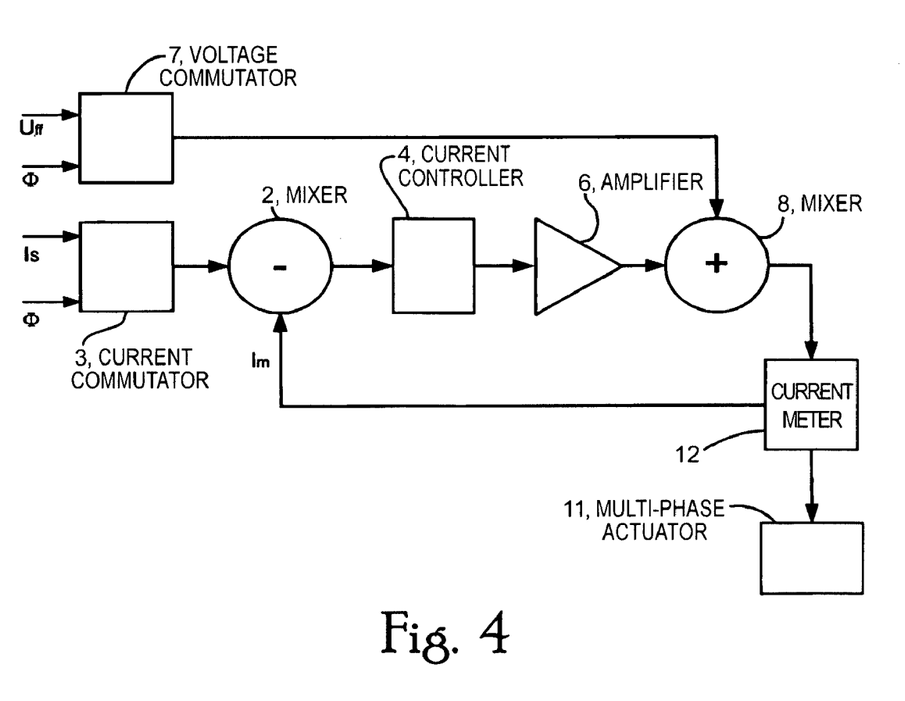
FIG. 4 depicts a feedforward control system for a current amplifier of a multi-phase actuator according to another exemplary embodiment of the present invention.

Referring to FIG. 4, the single-phase actuator of FIG. 2 is replaced with a multi-phase actuator 11, for example a three-phase motor. Each phase of the actuator 11 has a corresponding control system as illustrated in FIG. 6. Each control system is as in FIG. 2 with the addition of a current commutator 3 and a voltage commutator 7. The current commutator 3 has an input of the current setpoint $I_s$ and position dependent commutation phase information $\phi$. Voltage commutator 7 has an input of the voltage feedforward $U_{\mathit{ff}}$ and position dependent commutation phase information $\phi$. The position dependent commutation phase information $\phi$ represents the magnetic phase that the coil is experiencing. The information is dependent on position.

The current setpoint Is and the voltage feedforward $U_{\mathit{ff}}$ value are calculated in the same way as described above with reference to FIGS. 2 and 3. However, this only gives an output of the amplitude required, and does not consider the phase. The current commutator 3 converts the current setpoint $I_s$ from the motion controller into the correct value for that phase, using the position dependent commutation phase information $\phi$. Operation of the voltage commutator 7 is similar for calculating the voltage feedforward for the phase. However, this calculation must also consider that not all of the components in the voltage feedforward will vary with the magnetic phase the coil is experiencing, and so not all the components will need to be commutated.

It is therefore possible to use feedforward control with a multi-phase actuator having an arbitrary number of phases. Very little increase in complexity over the single-phase situation of the first embodiment is required. Furthermore, each calculation of current set-point and voltage feedforward need only be done once, there is no need to repeat it for each phase.

While specific embodiments of the invention has been described above, it will be appreciated that the invention may be practiced otherwise than as described. The description is not intended to limit the invention. In particular, although operation in terms of a current setpoint has been described, the present invention can be adapted for operation using a voltage setpoint. The present invention can also be adapted for use with capacitive (piezo) amplifiers.

While the use of three feedforward components has been described, it should be appreciated that more, or less, components could be used according to the requirements of each individual application. In particular, higher derivatives of position than jerk could be included, for example the derivative of jerk (D-jerk).

Although the embodiments have described the use of a DSP or microprocessor based controller, discrete components could be substituted with similar results.

What is claimed is:

1. A control system for a positioning device, comprising:
   a setpoint generator configured to calculate a desired current or voltage for supply to the positioning device according to at least one of a desired position and derivatives thereof of the positioning device;
   a controller configured to output a signal to be supplied to the positioning device according to the desired current or voltage;
   a sensor configured to measure a present value of current or voltage, wherein the controller is connected in a feedback loop such that the controller has as its input an error between the desired current or voltage and the present value of current or voltage;
   an adder configured to add a feedforward value to the signal before it is supplied to the positioning device; and
   a calculator configured to calculate the feedforward value using at least one of mechanical and electrical characteristics of the positioning device and at least one of the desired position and derivatives thereof of the positioning device.

2. A control system according to claim 1, wherein the feedforward value is a velocity feedforward value and the calculator is configured to calculate the velocity feedforward value using a back-emf of the positioning device and a desired velocity of the positioning device.

3. A control system according to claim 2, wherein the calculator is configured to calculate the velocity feedforward value by multiplying the back-emf of the positioning device and the desired velocity of the positioning device together.

4. A control system according to claim 1, wherein the feedforward value is an acceleration feedforward value and the calculator is configured to calculate the acceleration feedforward value using a reciprocal of a motor constant of the positioning device, an electrical resistance of the positioning device, an effective moving mass and a desired acceleration of the positioning device.

5. A control system according to claim 4, wherein the calculator is configured to calculate the acceleration feedforward value by multiplying the reciprocal of the motor constant of the positioning device, the electrical resistance of the positioning device, the effective moving mass and the desired acceleration of the positioning device together.

6. A control system according to claim 1, wherein the feedforward value is a jerk feedforward value and the calculator is configured to calculate the jerk feedforward value using a reciprocal of a motor constant of the positioning device, an effective moving mass, a self inductance of the positioning device and a desired jerk of the positioning device.

7. A control system according to claim 6, wherein the calculator is configured to calculate the jerk feedforward value by multiplying the reciprocal of the motor constant of the positioning device, the effective moving mass, the self inductance of the positioning device and the desired jerk of the positioning device together.

8. A control system according to claim 1, wherein the positioning device is a multiple phase actuator, and further comprising a commutator for each phase configured to adjust the value of the desired current or voltage and the feedforward value.

9. A control system according to claim 1, wherein the controller is one of a PID, PI, or a fuzzy logic controller.

10. A control system according to claim 1, wherein the controller is one of a programmable DSP, a microprocessor or a microcontroller.

11. A lithographic projection apparatus, comprising:
  a radiation system configured to provide a beam of radiation;
  a support configured to support a patterning device, the patterning device configured to pattern the beam according to a desired pattern;
  a substrate table configured to hold a substrate;
  a first positioning device configured to move the substrate table or the support;
  a projection system configured to project the patterned beam onto a target portion of substrate; and
  a control system configured to control the first positioning device, the control system comprising:
    a setpoint generator configured to calculate a desired current or voltage for supply to the positioning device according to a at least one of a desired position and derivatives thereof of the positioning device;
    a controller configured to output a signal to be supplied to the positioning device according to the desired current or voltage;
    a sensor configured to measure a present value of current or voltage, wherein the controller is connected in a feedback loop such that the controller has as its input an error between the desired current or voltage and the present value of current or voltage;
    an adder configured to a feedforward value to the signal before it is supplied to the positioning device; and
    a calculator configured to calculate the feedforward value using at least one of mechanical and electrical characteristics of the positioning device and at least one of the desired position and derivatives thereof of the positioning device.

12. A lithographic projection apparatus according to claim 11, wherein the positioning device is a multiple phase actuator, and further comprising a commutator for each phase configured to adjust the value of the desired current or voltage and the feedforward value.

13. A lithographic projection apparatus according to claim 11, further comprising:
  a second positioning device configured to move the other of the substrate table or the support; and
  a second control system configured to control the second positioning device, the second control system comprising:
    a second setpoint generator configured to calculate a second desired current or voltage for supply to the second positioning device according to a at least one of a second desired position and derivatives thereof of the second positioning device;
    a second controller configured to output a second signal to be supplied to the second positioning device according to the second desired current or voltage;
    a second sensor configured to measure a second present value of current or voltage, wherein the second controller is connected in a second feedback loop such that the second controller has as its input a second error between the second desired current or voltage and the second present value of current or voltage;
    a second adder configured to add second feedforward value to the second signal before it is supplied to the second positioning device; and
    a second calculator configured to calculate the second feedforward value using at least one of mechanical and electrical characteristics of the second positioning device and at least one of the second desired position and derivatives thereof of the second positioning device.

14. A lithographic projection apparatus according to claim 13, wherein the second positioning device is a second multiple phase actuator, and further comprising a second commutator for each phase configured to adjust the value of the second desired current or voltage and the second feedforward value.

15. A lithographic projection apparatus according to claim 11, wherein the controller is one of a PID, PI, or a fuzzy logic controller.

16. A lithographic projection apparatus according to claim 11, wherein the controller is one of a programmable DSP, a microprocessor or a microcontroller.

17. A control method for a positioning device, the method comprising:
  calculating a desired current or voltage for supply to the positioning device according to at least one of a desired position and derivatives thereof of the positioning device;

subtracting a present value of current or voltage from the desired current or voltage to calculate an error value;

inputting the error value to a controller which outputs a signal input to the positioning device;

calculating a feedforward value using at least one of mechanical and electrical characteristics of the positioning device and at least one of the desired position and derivatives thereof of the positioning device; and adding the feedforward value to the signal input to the positioning device.

18. A device manufacturing method, comprising:

providing a substrate that is at least partially covered by a layer of radiation-sensitive material;

providing a beam of radiation;

patterning the beam of radiation in its cross section with a patterning device;

projecting the patterned beam of radiation onto a target portion of the layer of radiation-sensitive material;

positioning the substrate or the patterning device with a positioning device; and controlling the positioning device by:

calculating a desired current or voltage for supply to the positioning device according to at least one of a desired position and derivatives thereof of the positioning device;

subtracting a present value of current or voltage from the desired current or voltage to calculate an error value;

inputting the error value to a controller which outputs a signal input to the positioning device;

calculating a feedforward value using at least one of mechanical and electrical characteristics of the positioning device and at least one of the desired position and derivatives thereof of the positioning device; and adding the feedforward value to the signal input to the positioning device.

19. A device manufactured by the method of claim 18.

* * * * *